Dec. 8, 1964 V. J. MEYERS 3,160,707

GAIN CONTROL IN RESPONSE TO AMBIENT NOISE LEVEL

Filed June 29, 1961

INVENTOR.
VERNON J. MEYERS

BY

ATTORNEYS

United States Patent Office 3,160,707

Patented Dec. 8, 1964

3,160,707
GAIN CONTROL IN RESPONSE TO AMBIENT NOISE LEVEL

Vernon J. Meyers, San Diego, Calif., assignor to the United States of America as represented by the Secretary of the Navy Filed June 29, 1961, Ser. No. 120,802
4 Claims. (Cl. 179—1)
(Granted under Title 35, U.S. Code (1952), sec. 266)

The invention described herein may be manufactured and used by or for the Government of the United States of America for governmental purposes without the payment of any royalties thereon or therefor.

This invention relates to a method and apparatus for controlling amplifier gain.

It is an object of this invention to provide a method and apparatus for controlling the gain of a transistor amplifier.

It is another object of this invention to provide an ambient noise-acclimated audio system for enabling transmission of intelligence to personnel exposed to high intensity noise.

These and other objects, features and advantages of the invention will be apparent from, and will be referred to in, the following description in conjunction with the drawings in which.

Figure 1:
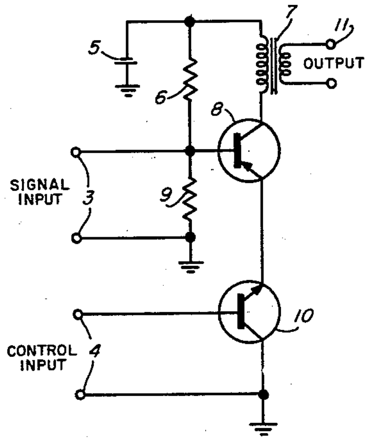
FIG. 1 shows schematically an embodiment of a transistor amplifier according to the invention.

Referring to the embodiment of the invention in FIG. 1 the positive terminal of power supply 5 is grounded and the negative terminal is connected to one end of resistor 6 and one end of the primary winding of transformer 7. The other end of resistor 6 is connected to the base of PNP transistor 8 and the collector of the transistor is connected to the other end of the transformer primary winding. The ends of resistor 9 are connected in shunt with signal input terminals 3, and to the base of transistor 8 and ground, respectively. Secondary winding of transformer 7 is connected to output terminals 11. The emitter of transistor 8 is connected to the collector of NPN transistor 10. The emitter of transistor 10 is grounded. Control input terminals 4 are connected to the base of transistor 10 and ground, respectively.

PNP transistor 8 functions as a common-emitter amplifier of signals applied to signal input terminals 3. The output of the amplifier appears at terminals 11. Although an iron-core transformer is shown for the amplifier load impedance, a resistor or other types of transformers, for example, an adjustable-inductor core transformer, could be used. The gain of the amplifier is dependent on the resistance between the emitter of transistor 8 and ground. The emitter-collector resistance of NPN transistor 10 is a function of the potential applied to control input terminals 4. Thus, the gain of the transistor amplifier depends on the potential applied to the control input terminals 4. With no potential applied to terminals 4 the amplifier has close to zero gain and the potential on the base of transistor 10 becomes negative with respect to ground. As a control potential applied to terminals 4 approaches ground, the emitter-collector resistance of transistor 10 will decrease and the gain of the transistor amplifier will increase.

A PNP transistor may be substituted for NPN transistor 10 if the emitter of the former is grounded and the collector is connected to the emitter of transistor 8. When terminals 4 are then open circuited, the base of the PNP transistor will be at ground potential. The application of a negative potential to the terminals will decrease the emitter-collector resistance of the transistor and the gain of the transistor amplifier will increase. By controlling the amplitude of the potential applied to terminals 4, the gain of the transistor amplifier can be controlled.

The embodiment of the invention shown in FIG. 1 offers a reliable and stable method of signal-control of gain. The circuit can be used, for example, for automatic gain control (A.G.C. or A.V.C.) in RF or IF stages in radio receivers or television receivers.

Effective face-to-face or even mouth-to-ear voice communication is impossible in environments where the ambient noise pressure level exceeds 110 db (referenced to 0.0002 dyne per sq. cm.). For example, noise levels, on an aircraft carrier wherein jet aircraft are operated vary from 110 db to 135 db at manned locations and often peaks up to 150 db exist when aircraft are launched or after burners are used. In accordance with the invention, apparatus is depicted in FIG. 2 for providing transmission of audio intelligence to personnel subjected to fluctuating, high intensity ambient noise.

Figure 2:
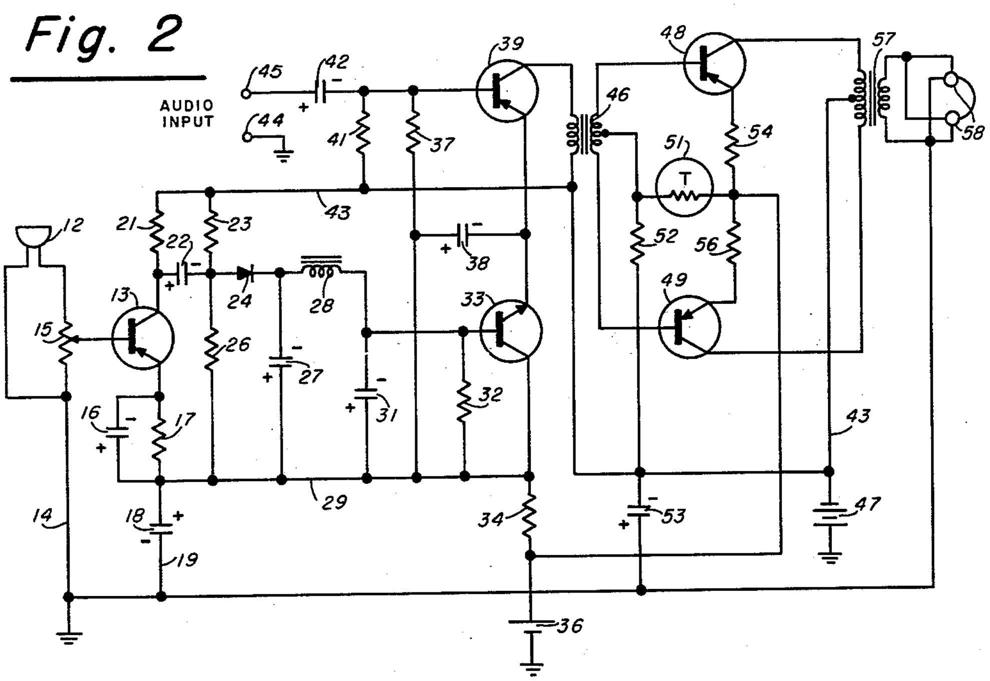
FIG. 2 is a schematic illustration of a gain-controlled audio system according to the invention.

Referring to FIG. 2, a microphone 12 is connected in shunt with the resistive element of potentiometer 15. The wiper of the potentiometer is connected to a PNP transistor 13 which is capable of amplifying signals having frequencies in the audio band. One lead of the microphone is grounded by means of lead 14. Capacitor 16 and resistor 17 are shunted together. One side of resistor 17 is connected to the emitter of transistor 13 and the other side is connected to capacitor 18. Lead 19 of capacitor 18 is grounded. One end of capacitor 22 and one end of resistor 21 are connected to the collector of transistor 13. The other ends of capacitor 22 and resistor 21 are connected to the two ends of resistor 23, respectively. The anode of diode 24 is connected to the junction of capacitor 22 and resistor 23. The ends of resistor 26 are connected to the anode of diode 24 and lead 29, respectively. The cathode of diode 24 is connected to one end of filter choke 28 and one end of capacitor 27. The other end of capacitor 27 is connected to lead 29. The other end of filter choke 28 is connected to one side of capacitor 31, one side of resistor 32 and the base of NPN transistor 33. Lead 29 is connected to the other sides of capacitor 31 and resistor 32. The collector of transistor 33 is connected to lead 29 and one end of resistor 34. The other end of resistor 34 is connected to D.-C. power supply 36. The negative terminal of the power supply is grounded. Lead 29 is also connected to one end of capacitor 38 and one end of resistor 37. The other end of capacitor 38 is connected to the emitter of transistor 33 and the emitter of PNP transistor 39. The other end of resistor 37 is connected to the base of transistor 39, one end of resistor 41 and one end of capacitor 42. The other end of resistor 41 is connected to lead or bus 43. The other end of capacitor 42 is connected to input terminal 45. Grounded terminal 44 is another input terminal. The collector of transistor 39 is connected to one end of the primary winding of iron-core coupling transformer 46. The other end of the primary winding is connected to lead 43. The positive terminal of power supply 47 is connected to ground and the negative terminal is connected to lead 43. The ends of the secondary winding of transformer 46 are connected to the bases of PNP transistors 48 and 49, respectively. Transistors 48 and 49, as well as transistor 39, are of the type suited to amplify audio signals. The center tap of the secondary winding is connected to one end of thermistor 51 and one end of resistor 52. The other end of resistor 52 is connected to bus 43. The other end of thermistor 51 is connected to one end of resistor 54, one end of resistor 56 and the positive terminal of power supply 36. Capacitor 53 is connected between bus 43 and ground. The emitters of transistors 48 and 49 are connected to the other ends of resistors 54 and 56, respectively. The collectors of transistors 48 and 49 are connected to the opposite ends of the primary winding of iron-core, output transformer 57, respectively. The center tap of the primary winding is connected to lead 43. Headphones 58 are connected in shunt with the secondary winding of the transformer. One side of the secondary winding is grounded.

The components in the circuit of FIG. 2 may, for example, have the following specifications:

Microphone 12—1,000 ohms
Potentiometer 15—5,000 ohms
Resistor 17—10,000 ohms
Resistor 21—33,000 ohms
Resistor 23—1,000,000 ohms
Resistor 26—100,000 ohms
Resistor 32—560,000 ohms
Resistor 34—270 ohms
Resistor 37—4,700 ohms
Resistor 41—22,000 ohms
Resistor 52—12,000 ohms
Resistor 54—10 ohms
Resistor 56—10 ohms
Thermistor 51—100 ohms (D204)
Capacitor 16—12 μf., 15 v.
Capacitor 18—25 μf., 6 v.
Capacitor 22—0.05 μf.
Capacitor 27—1.7 μf., 125 v.
Capacitor 31—12 μf., 50 v.
Capacitor 38—12 μf., 15 v.
Capacitor 42—2 μf., 50 v.
Capacitor 53—12 μf., 15 v.
Filter choke 28—0.1 henry
Diode 24—IN458
Transistor 33—2N118
Transistors 13, 39, 48, 49—2N43A
Transformer 46—100,000 ohms: 3,000 ohms
Transformer 57—2,500 ohms: 8 ohms
Headphones—16 ohms
Power soure 36—2.5 volts
Power source 47—15 volts Referring again to FIG. 2, when the circuit is in operation, audio signals impressed on input terminals 45 and 44 are amplified by transistor 39 which serves as a low-level audio amplifier. The gain of the amplifier is approximately a linear function of its emitter current. This current passes through transistor 33 whose D.-C. resistance (pass characteristic) varies inversely with its base bias voltage.

The sound pressure level of ambient noise impinging on microphone 12 produces voltages across potentiometer 15. The voltages are amplified in transistor 13 and rectified by diode 24. The rectified voltages are integrated in a smoothing filter comprising capacitors 27 and 31 and filter choke 28. The output of the filter provides the base bias for controlling the D.-C. resistance of transistor 33. Thus, as the sound pressure level of ambient noise varies, the D.-C. resistance of transistor 33 and the gain of transistor 39 varies. The collector of transistor 33 is bypassed to ground by means of capacitor 18 to eliminate degeneration from being introduced into the amplifier stage employing transistor 39.

During periods when the ambient noise subsides, the gain of the controlled amplifier is prevented from going to zero by the application of a quiescent condition bias on the base of transistor 33 by means of resistor 32. Resistors 23 and 26 are connected between the positive terminal of power supply 36 (through resistor 34) and the negative terminal of power supply 47. This resistor-type voltage divider keeps the anode of diode 24 negative during quiet periods and prevents a quiescent bias from being applied to the base of transistor 33 because of forward conduction of the diode.

The amplified audio output signals of transistor 39 are further amplified in a push-pull, class B power amplifier employing PNP transistors 48 and 49. Thermistor 51 temperature stabilizes the bias on transistors 48 and 49. The audio signals amplified by the push-pull amplifier are reproduced in headphones 58. Employing the specific circuit components mentioned above, it is possible to produce a headphone input power of 100 milliwatts. Power in excess of this amount may cause heavy impairment damage to the wearer of the headphones. The headphones are preferably of the type set in pliant caps which surround the ear, press against the head and attenuate ambient noise in the audio spectrum. The RCA type HI58/AIC earphone-hearing defender combination is an example of the above type headphone. It is capable of attenuating ambient noise in the audio spectrum at least 20 db. Microphone 12 is preferably located close to the ears of the headphone wearer so as to be subjected to the same ambient noise as the wearer.

Figure 3:
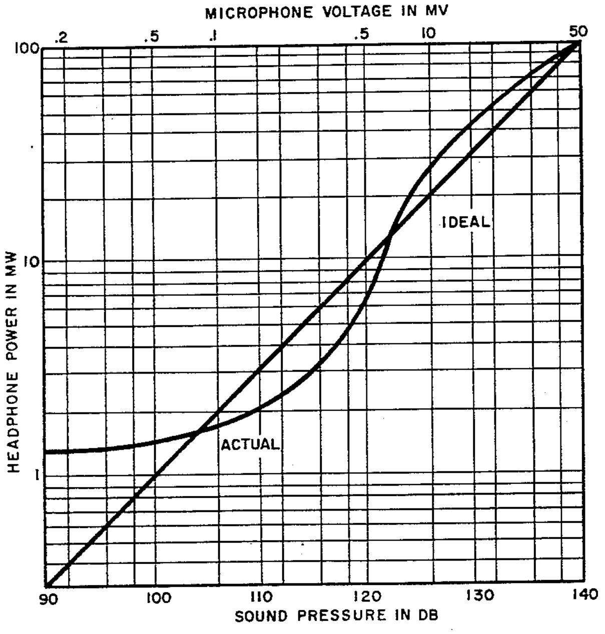
FIG. 3 is a graph depicting characteristics of the system of FIG. 2.

FIG. 3 shows the output characteristics of the apparatus depicted in FIG. 2. Headphone power in milliwatts is displayed along the ordinate of the graph and ambient noise sound pressure in decibels is shown along the abscissa. For comparison a so-called "ideal" curve is plotted along with the actual curve. The ideal curve is based upon the premise that the rate of headphone power increase should be 5 db per 10 db of increased sound pressure reaching 100 milliwatts at 140 db. The graph indicates that the actual headphone output varies from 2 mw. at 90 db ambient noise to 100 mw. at 140 db and closely follows the ideal output.

As the apparatus of FIG. 2 employs solid-state circuitry, it may be contained in a very small portable package and carried on the person of the headphone user. Audio input signals for the circuit may be derived, for example, from a small radio receiver (not shown) also carried by the headphone user.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed is:

1. In a noise-acclimated audio reproducing system the combination comprising, a transducer for producing output voltages when subjected to ambient noise sound pressure, means connected to said transducer for amplifying said output voltages, means connected to said amplifying means for rectifying said amplified voltages, a bias-controlled variable D.-C. resistance having a control input, said control input being coupled to said means for rectifying, means for amplifying audio signals, said amplifying means having an input for said audio signals, a current-control terminal and an output, means for connecting said resistance to said terminal, means for audibly reproducing said amplified signals, and means for connecting said amplifying means output to said reproducing means.

2. An audio reproducing system for producing clear and usable signals in an environment of high intensity noise comprising, a noise-sensitive transducer, an amplifier, means for connecting said amplifier to said transducer, a rectifier, means for connecting said rectifier to said amplifier, an audio amplifier having an input for applying audio signals, an output and a current control terminal, transistor means for controlling the current in said audio amplifier, means for coupling said transistor means to said terminal and to said rectifier, audio reproducing means for reproducing the amplified signals from said audio amplifier and means for coupling said reproducing means to said audio amplifier output.

3. A system for reproducing sounds in an environment of high intensity noise comprising a transducer for generating an output voltage when subjected to ambient noise sound pressure, means for amplifying said output voltage, said amplifying means having an input coupled to said transducer and an output, a rectifier having an input connected to the output of said amplifying means, and an output, a PNP transistor, an NPN transistor, the emitter of said PNP transistor being connected to the emitter of said NPN transistor, a power source having a negative-potential terminal and a positive-potential terminal, a transformer having two input terminals and two output terminals, said transformer input terminals being connected to said negative-potential terminal and the collector of said PNP transistor, respectively, means for connecting said positive-potential terminal to the collector of said NPN transistor, a first resistor, means for connecting said first resistor between said negative-potential terminal and the base of said PNP transistor, a second resistor connected between said base of said PNP transistor and said collector of said NPN transistor, an audio-signal input terminal coupled to said base of said PNP transistor, means for coupling the output of said rectifier to the base of said NPN transistor, means for amplifying audio signals connected to said transformer outputs, and means for reproducing said audio signals coupled to the output of said audio-signal amplifying means.

4. Apparatus according to claim 3 wherein said reproducing means comprises two earphones each set in a noise-attenuating, cup-shaped support.

References Cited by the Examiner

UNITED STATES PATENTS

| | | | |
|---|---|---|---|
| 2,420,933 | 5/47 | Crawford et al. | 330—149 X |
| 2,878,380 | 3/59 | Holmes | 330—13 X |
| 2,994,833 | 8/61 | Cerofolini | 330—18 |
| 3,002,090 | 9/61 | Hirsch | 330—29 X |

NATHAN KAUFMAN, *Acting Primary Examiner.*

ROY LAKE, *Examiner.*